May 24, 1966 O. DALTON ETAL 3,253,225
HYBRID AMPLIFIER CIRCUIT
Filed April 26, 1962

INVENTORS.
OLIVER DALTON
ROBERT G. RULLMAN
BY
BUCKHORN, CHEATHAM & BLORE
ATTORNEYS

United States Patent Office 3,253,225

Patented May 24, 1966

3,253,225

HYBRID AMPLIFIER CIRCUIT

Oliver Dalton and Robert G. Rullman, Beaverton, Oreg., assignors to Tektronix, Inc., Beaverton, Oreg., a corporation of Oregon Filed Apr. 26, 1962, Ser. No. 190,270
9 Claims. (Cl. 330—3)

Figure 1:
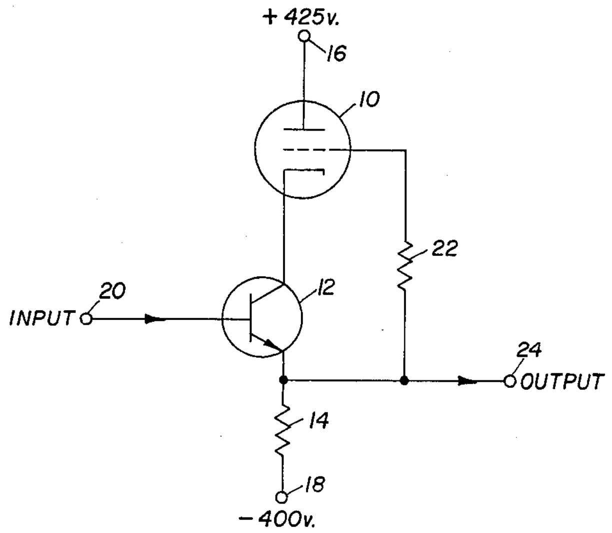

The present invention relates generally to electrical amplifier circuits and in particular to hybrid amplifier circuits containing at least one semiconductor device connected as an emitter-follower amplifier and an electron discharge device connected as a cathode-follower amplifier.

The hybrid amplifier of the present invention is extremely useful as a current amplifier or as an impedance matching device to connect a first circuit having a high output impedance to a second circuit having a lower input impedance so that electrical signals may be transmitted from such first circuit to such second circuit without an appreciable loss in amplitude over a wide range of frequencies. It can also be employed with loads having high impedance and has very good linearity characteristics when employed to transmit high amplitude signals. Thus the hybrid amplifier of the present invention is particularly useful as part of the horizontal sweep amplifier of a cathode ray oscilloscope to drive the horizontal deflection plates of a cathode ray tube.

The hybrid amplifier has many advantages over both the conventional cathode-follower amplifier and the conventional emitter-follower amplifier. It has a lower input capacitance than either of such conventional amplifiers which enables better high frequency response by increasing the high frequency input impedance and may also have a lower output impedance. The voltage gain of the hybrid amplifier is closer to one than the conventional cathode-follower amplifier so that there is less loss in amplitude of the signal transmitted therethrough. In addition to these primary advantages, the hybrid circuit of the present invention combines the nearly unity voltage gain of the emitter-follower amplifier with the high voltage swing capability of the cathode follower amplifier so that large changes in amplitude of the input signal can be transmitted through such circuit without appreciable distortion.

One embodiment of the hybrid amplifier circuit of the present invention may include a transistor having its base connected to the input terminal of such hybrid amplifier, a vacuum tube having its cathode connected to the collector of such transistor and its grid connected to the emitter of such transistor. A common load impedance may be connected to the emitter of such transistor in series with the anode-cathode circuit of such vacuum tube so that the transistor is connected as an emitter follower amplifier and the tube is connected as a cathode follower amplifier. An input signal applied to the base of such transistor will be transmitted to the grid of such vacuum tube without substantially changing its voltage amplitude and phase relationship so that a similar signal is developed at the cathode of tube and applied to the collector of such transistor. This causes the voltage of the collector to follow the signal on such emitter to increase the linearity of response of such transistor during wide voltage amplitude swings of input signal so that the output signal taken across the common load impedance is relatively undistorted over a wide range of frequencies.

Therefore, one object of the present invention is to provide an improved electrical amplifier circuit having an extremely low input capacitance for increased high frequency response.

A second object of the invention is to provide an improved hybrid amplifier circuit in which an electron discharge device, a semiconductor device and a load impedance are employed in such a manner that such discharge device is connected as a cathode follower amplifier and such semiconductor device is connected as an emitter follower amplifier to provide such hybrid amplifier with an extremely low input capacitance and a voltage gain close to one.

Another object of the invention is to provide an improved hybrid cathode follower type amplifier circuit in which a transistor and a vacuum tube are employed along with a common load impedance so that such transistor is connected as an emitter-follower amplifier and such tube is connected as a cathode follower amplifier in order to combine the near unity voltage gain of such emitter follower with the high voltage swing capability of such cathode follower to increase the useful range of operation of such hybrid amplifier.

Still another object of the present invention is to provide an improved hybrid cathode follower amplifier in which an NPN type transistor and a triode vacuum tube are employed along with a common load impedance which is connected to the emitter of such transistor in series with the cathode-anode circuit of such tube, with the cathode of such tube connected to the collector of such transistor and the grid of such tube connected to the emitter of such transistor so that such vacuum tube is connected as a cathode-follower amplifier and such transistor is connected as an emitter-follower amplifier in order to provide such hybrid amplifier with a low input capacitance, a low output impedance and a voltage gain close to one.

A further object of the invention is to provide an improved hybrid cathode-follower amplifier in which a first transistor, a second transistor and a vacuum tube are employed with a load impedance and are connected so that each of such transistors functions as an emitter-follower amplifier and such vacuum tube functions as a cathode-follower amplifier to provide such hybrid amplifier with increased current gain, low input capacity, low output impedance and a voltage gain close to one.

Figure 2:
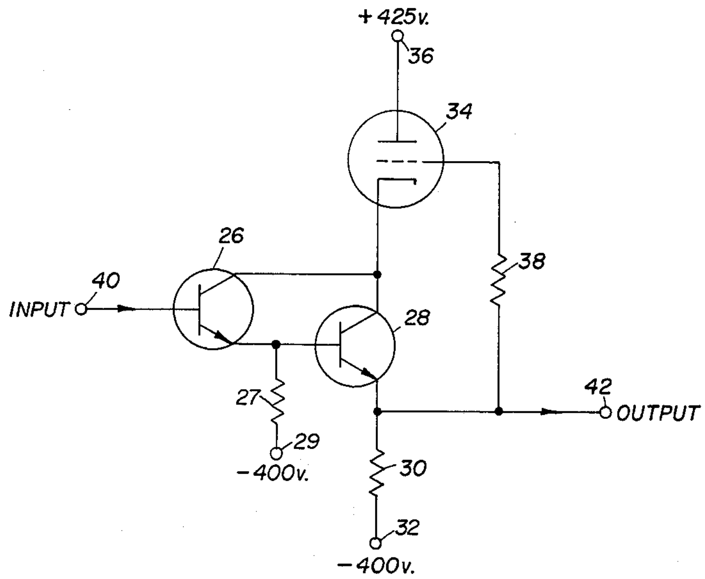

Additional objects and advantages of the present invention will become apparent from the following detailed description of preferred embodiments thereof shown in the attached drawings, of which:

FIG. 1 shows one embodiment of the hybrid cathode-follower amplifier of the present invention; and FIG. 2 shows another embodiment of the hybrid amplifier of the present invention.

The embodiment of the hybrid amplifier of the present invention shown in FIG. 1 includes an electron discharge device 10, such as a type 6922 triode vacuum tube, and a semiconductor device 12, such as an NPN type 2N 1973 transistor. The cathode of vacuum tube 10 is connected to the collector electrode of transistor 12 while the emitter electrode of such transistor is connected to a common load impedance 14 which may contain inductive or capacitive elements and is shown as a resistor merely for the sake of clarity. The anode of vacuum tube 10 is connected at terminal 16 to a source of positive D.C. voltage while the end of load impedance 14 remote from the emitter of transistor 12, is connected at terminal 18 to a source of negative D.C. voltage so that such transistor and such vacuum tube are quiescently biased conducting. Thus there is D.C. current flow in the collector-emitter circuit of the transistor under quiescent conditions when no input signal is applied to the base of transistor 12 through the input terminal 20. The control grid of vacuum tube 10 is connected to the emitter electrode of transistor 12 through a resistor 22 of about 100 ohms in order to maintain such grid substantially at the voltage of such emitter which may be at a D.C. bias voltage of about +150 volts while the base of such transistor may be quiescently biased slightly above 150 volts. The resistor 22 is not essential and may be eliminated so that the grid of vacuum tube 10 may be connected directly to the emitter of transistor 12.

The load impedance 14 may contain a large amount of resistance, such as a 680 kilohm resistor, if desired in order to provide current stability by "long tailing" so that changes of electron emission by the cathode of tube 10 due to variations of filament voltage and tube aging do not cause any appreciable change in this D.C. current. However, it should be noted that a cathode follower amplifier has the characteristic that its output signal follows its input signal faster for positive going input signals than for negative going input signals when it has a large capacitive load impedance, such as the deflection plates of a cathode ray tube. This is due to the fact that for positive going input signals the charging rate of the load capacitor is determined by the RC time constant of such capacitor and the small internal resistance of the conducting vacuum tube, while for negative going input signals the rate of discharge of such capacitor is determined by the much larger resistance of the cathode load resistor since the vacuum tube is then non-conducting so that the only discharge path is through such load resistor. Therefore, it appears that the use of a large cathode resistor for long tailing is not desirable when the cathode follower is used to drive the horizontal deflection plates of a cathode ray oscilloscope. However, this disadvantage can be overcome to some extent by connecting a separate cathode follower to each deflection plate and using a push-pull type of power amplifier to drive these two cathode followers with input signals that are 180° out of phase. In addition, a source of substantially constant current may be connected to the cathode resistor of the cathode follower which drives the normally negative horizontal deflection plate that receives the negative horizontal sweep signal, in order to supply sufficient current to discharge the deflection plate capacitance through such cathode resistor at the same rate even when the tube is cut off. The above discussion also applies in general to NPN transistors connected as emitter-follower amplifiers since a negatively going input signal will likewise cause such transistor to become momentarily non-conductive when it is connected to a high capacitance load. Therefore, the hybrid cathode follower of the present invention can be provided with current stability and a voltage gain which is closer to unity than a conventional cathode follower, through the use of a large resistor as part of the load impedance 14 without substantially affecting its performance when used in the horizontal amplifier of a cathode ray oscilloscope.

When an input signal is applied to the input terminal 20, an output signal is developed across the load resistor 14 at the output terminal 24 which has substantially the same voltage amplitude and phase relationship as such input signal. There is little change in the emitter-to-base bias voltage to cause an increase or decrease in the thickness of the space charge region of the emitter junction and correspondingly little change in capacity of such emitter junction. Therefore, the effective input capacitance of such emitter junction is low. The signal voltage developed at the emitter of transistor 12 is transmitted through resistor 22 to the grid of vacuum tube 10. Since vacuum tube 10 is connected as a cathode follower, signal voltage is developed on the cathode of such tube which has substantially the same voltage amplitude and phase relationship as the signal voltage applied to such grid. Thus, the collector electrode of transistor 10 closely follows the signal voltage on the emitter electrode of such transistor so that it is possible to apply large amplitude voltage swings of input signal to the base of transistor 12 before producing appreciable distortion in the output signal due to the non-linearity of response of the hybrid amplifier of the present invention. Another effect of this clamping of the collector electrode to the emitter electrode is to maintain the base-to-collector voltage substantially constant so that there is little change in the value of the capacitance of the collector junction with varying input signals which is not true of conventional emitter-follower amplifiers. This produces a lower effective input capacitance for such collector junction which results in a lower total input capacity for the hybrid cathode follower amplifier. In addition to providing a lower input capacity, the hybrid cathode follower amplifier of the present invention may also have a lower output impedance than a conventional cathode follower amplifier under certain conditions. However, this may not always be true because the output resistance of a transistor depends upon the resistance of the generator circuit supplying input signals to such transistor.

A second embodiment of the hybrid cathode follower circuit of the present invention is shown in FIG. 2. This circuit is similar to the circuit shown in FIG. 1 with the exception that another semiconductor device 26, such as an NPA type transistor, and its emitter load resistor 27 have been added to the circuit. The collector of the transistor 26 is connected to the collector electrode of a second transistor 28 and the emitter the transistor 26 is connected to a source of negative D.C. bias voltage 29 through the load resistor 27 along with the base of such second transistor so that each of these transistors is connected as an emitter-follower amplifier. The emitter of transistor 28 is connected at 32 to a source of negative D.C. bias voltage through a common load impedance 30 and the collector of such transistor is connected to the cathode of an electron discharge device 34, such as a triode vacuum tube, whose anode is connected at 36 to a source of positive D.C. voltage. The grid of the vacuum tube 34 is connected to the emitter of the second transistor 28 through a grid resistor 38 which suppresses parasitic oscillations similar to grid resistor 22 of FIG. 1. The input signal is applied to the base of the first transistor 26 at input terminal 40 and the output signal of the hybrid amplifier circuit is obtained across load impedance 30 at output terminal 42.

It is apparent that circuit elements 28, 30, 34 and 38 of FIG. 2 perform substantially the same function as circuit elements 12, 14, 10 and 22, respectively. Since the first transistor 26 and the second transistor 28 are connected as a pair of cascaded emitter-follower amplifiers, the input signal applied to the base of the transistor 26 causes a signal voltage to be developed on the emitter of such first transistor which has substantially the same voltage amplitude and phase as such input signal. The load resistor 27 and voltage source 29 may be omitted, but they improve the high frequency response of the transistor 26 on negative going input signals and provide a more suitable quiescent operating point for such transistor. The emitter signal voltage developed across load resistor 27 is applied to the base of the second transistor 28 and the operation of the remainder of the circuit is substantially the same as that described with respect to FIG. 1. However, the hybrid amplifier circuit of FIG. 2 provides an even lower input capacitance and a lower output impedance than the circuit of FIG. 1. In addition, the added transistor 26 provides more current gain for the circuit of FIG. 2. It should be noted that the advantages of the hybrid amplifier circuit of the present invention are largely due to the fact that the nearly unit voltage gain of the emitter-follower amplifier is combined with the high voltage swing capability of the cathode follower amplifier.

It will be apparent that various changes may be made in the details of the above-described preferred embodiments of the present invention without departing from the spirit of the invention. Therefore, the scope of the present invention should be determined only by the following claims.

We claim:

1. A direct coupled electrical amplifier circuit, comprising:

a semiconductor device having emitter, collector and base electrodes and having said base connected to an input terminal of said amplifier circuit and having said emitter connected to an output terminal of said amplifier circuit;

an electron discharge device having cathode, anode and grid electrodes and having the cathode-anode circuit of said discharge device connected in series with the emitter-collector circuit of said semiconductor device;

means for D.C. coupling the grid of said discharge device to the emitter of said semiconductor device so that the D.C. voltages of said grid and said emitter are substantially equal; and a load impedance connected to said semiconductor device as an emitter impedance and to said discharge device as a cathode impedance so that the output signal obtained across said load impedance is substantially the same as the input signal applied to said input terminal over a wide range of frequencies.

2. An electrical amplifier circuit, comprising:

a semiconductor device having emitter, collector and base electrodes;

a vacuum tube having cathode, anode and grid electrodes with the cathode-anode circuit of said tube connected in series with the emitter-collector circuit of said semiconductor device;

means connecting the grid of said tube to emitter of said semiconductor device so that the D.C. voltages of said grid and said emitter are substantially equal;

a load impedance connected to said semiconductor device and in series with said tube in such a manner that said semiconductor device is connected as an emitter follower amplifier and said tube is connected as a cathode follower amplifier; and means for applying an input signal to said base of said semiconductor device and for direct coupling said signal to said grid through said emitter to produce an output signal across said load impedance by controlling the current flowing through both said emitter-collector circuit and said cathode-anode circuit.

3. An electrical amplifier circuit, comprising:

a transistor having emitter, collector and base electrodes;

a vacuum tube having cathode, anode and grid electrodes with the cathode-anode circuit of said tube connected in series with the emitter-collector circuit of said transistor;

means for D.C. coupling the emitter of said transistor to the grid of said tube and for applying substantially the same D.C. bias voltage to said grid and said emitter;

a load impedance connected to said emitter of said transistor in series with said cathode-anode circuit and said emitter-collector circuit so that said transistor is connected as an emitter follower amplifier and said tube is connected as a cathode follower amplifier; and means for biasing said transistor and said tube quiescently conducting so that an input signal applied to said base of said transistor is transmitted to said grid through said emitter and produces an output signal across said load impedance of substantially the same voltage amplitude and phase as said input signal by controlling the current flowing through both said emitter-collector circuit and said cathode-anode circuit.

4. A hybrid amplifier circuit, comprising:

a transistor having emitter, collector and base electrodes connected as an emitter follower amplifier with said base being connected to the input terminal of said hybrid amplifier;

a vacuum tube having cathode, anode and grid electrodes connected as a cathode follower amplifier with said cathode being connected to said collector of said transistor;

a common load impedance connected to said emitter in series with the cathode-anode circuit of said tube and the emitter-collector circuit of said transistor so that said impedance functions both as an emitter load impedance for said transistor and as a cathode load impedance for said tube;

a coupling resistance connected from said emitter of said transistor to said grid of said tube so that when an input signal is applied to said base of said transistor said signal is directly coupled from said emitter to said grid of said tube and produces an output signal across said load impedance by controlling the current flow in both said emitter-collector circuit and said cathode-anode circuit;

means for applying substantially the same quiescent D.C. voltage to said grid and to said emitter so that the grid-to-cathode bias voltage of said tube is approximately equal to the emitter-to-collector bias voltage of said transistor.

5. A hybrid cathode follower amplifier circuit, comprising:

an NPN type transistor having emitter, collector and base electrodes connected as an emitter follower amplifier with said base being connected as the input terminal of said hybrid amplifier;

a vacuum tube having cathode, anode and grid electrodes connected as a cathode follower amplifier with said cathode being connected to said collector of said transistor;

a common load impedance connected to said emitter in series with the cathode-anode circuit of said tube and the emitter-collector circuit of said transistor so that said impedance functions both as an emitter load impedance for said transistor and as a cathode load impedance for said tube; and means for D.C. coupling said emitter of said transistor to said grid of said tube and for applying substantially the same D.C. bias voltage to said emitter and said grid so that when an input signal is applied to said base of said transistor said signal is transmitted to said grid of said tube and produces an output signal across said load impedance which has substantially the same voltage amplitude and phase as said input signal by controlling the current flow in both said emitter-collector circuit and said cathode-anode circuit.

6. A hybrid cathode follower amplifier circuit, comprising:

an NPN type transistor having emitter, collector and base electrodes connected as an emitter follower amplifier with said base being connected to the input terminal of said hybrid amplifier;

a triode type vacuum tube having cathode, anode and grid electrodes connected as a cathode follower amplifier with said cathode being connected to said collector of said transistor;

a common load impedance connected to said emitter in series with the cathode-anode circuit of said tube and the emitter-collector circuit of said transistor so that said impedance functions both as an emitter load impedance for said transistor and as a cathode load impedance for said tube;

means to apply a positive D.C. bias voltage to said anode of said tube and a negative D.C. bias voltage to said load impedance so that said transistor and said tube normally conduct current and to apply substantially the same D.C. bias voltage to said emitter and said base; and a coupling resistor connected to provide a direct coupling from said emitter of said transistor to said grid of said tube so that when an input signal is applied to said base of said transistor said signal is transmitted to said grid of said tube and produces an output signal across said load impedance by controlling the current flow in both said emitter-collector circuit and said cathode-anode circuit.

7. A hybrid amplifier circuit, comprising:

a first semiconductor device having emitter, collector and base electrodes connected as an emitter follower amplifier with its base connected to the input terminal of said hybrid amplifier circuit;

a second semiconductor device having emitter, collector and base electrodes connected as an emitter-follower amplifier with its base connected to the emitter of said first semiconductor device;

an electron discharge device having anode, cathode and control grid electrodes connected as a cathode follower amplifier with its cathode connected to the collector of said first semiconductor device and the collector of said second semiconductor device;

means for D.C. coupling said control grid to the emitter of said second semiconductor device and for applying substantially the same D.C. bias voltage to said grid and to the emitter of said second semiconductor device; and a common load impedance connected to the emitter of said second semiconductor device so that it functions as an emitter load impedance for said second semiconductor device and as a cathode load impedance for said discharge device.

8. A hybrid cathode follower amplifier circuit, comprising:

a first transistor having emitter, collector and base electrodes connected as an emitter follower amplifier with its base connected to the input terminal of said hybrid amplifier circuit;

a second transistor having emitter, collector and base electrodes connected as an emitter follower amplifier in cascade with said first transistor so that the base of said second transistor is connected to the emitter of said first transistor;

a vacuum tube having anode, cathode and control grid electrodes connected as a cathode follower amplifier with its cathode connected to the collector of said first transistor and the collector of said second transistor;

means for D.C. coupling said control grid to the emitter of said second transistor and for applying substantially the same D.C. bias voltage to said grid and to the emitter of said second transistor;

an emitter load impedance connected to the emitter of said first transistor; and a common load impedance connected to the emitter of said second transistor so that it functions as an emitter load impedance for said second transistor and as a cathode load impedance for said tube.

9. A hybrid cathode follower amplifier circuit, comprising:

a first NPN type transistor having emitter, collector and base electrodes connected as an emitter follower amplifier with its base connected to the input terminal of said hybrid amplifier circuit;

a second NPN type transistor having emitter, collector and base electrodes connected as an emitter follower amplifier with its base connected to the emitter of said first transistor;

a vacuum tube having anode, cathode and control grid electrodes connected as a cathode follower amplifier with its cathode connected to the collector of said first transistor and the collector of said second transistor;

means for D.C. coupling said control grid to the emitter of said second transistor and for applying substantially the same D.C. bias voltage to said grid and to the emitter of said second transistor;

an emitter load resistor connected to the emitter of said first transistor;

a coupling resistor connected between said grid of said tube and said emitter of said second transistor; and a common load impedance connected to the emitter of said second transistor so that it functions as an emitter load impedance for said second transistor and as a cathode load impedance for said tube.

References Cited by the Examiner

UNITED STATES PATENTS

| | | | |
|---|---|---|---|
| 2,592,193 | 4/1952 | Saunders | 330—70 |
| 2,691,101 | 10/1954 | Casey. | |
| 2,795,654 | 6/1957 | Macdonald | 330—70 |
| 3,105,196 | 9/1963 | Lerner | 330—18 X |

FOREIGN PATENTS

| | | |
|---|---|---|
| 877,019 | 9/1961 | Great Britain. |

OTHER REFERENCES

Article by Davidson et al.: Unity-Gain Amplifier Offers High Stability—Electronics publication—February 26, 1960 pages 66 and 67.

NATHAN KAUFMAN, *Acting Primary Examiner.*

ROY LAKE, *Examiner.*